(12) United States Patent
Tarakji

(10) Patent No.: US 10,714,623 B2
(45) Date of Patent: Jul. 14, 2020

(54) APPROACH FOR AN AREA-EFFICIENT AND SCALABLE CMOS PERFORMANCE BASED ON ADVANCED SILICON-ON-INSULATOR (SOI), SILICON-ON-SAPPHIRE (SOS) AND SILICON-ON-NOTHING (SON) TECHNOLOGIES

(71) Applicant: Ahmad Houssam Tarakji, Sacramento, CA (US)

(72) Inventor: Ahmad Houssam Tarakji, Sacramento, CA (US)

( * ) Notice: Subject to any disclaimer, the term of this patent is extended or adjusted under 35 U.S.C. 154(b) by 0 days.

(21) Appl. No.: 15/731,883

(22) Filed: Aug. 18, 2017

(65) Prior Publication Data

US 2017/0358686 A1    Dec. 14, 2017

Related U.S. Application Data

(63) Continuation-in-part of application No. 14/821,685, filed on Aug. 7, 2015, now Pat. No. 9,741,857.

(51) Int. Cl.
*H01L 29/786* (2006.01)
*H01L 27/12* (2006.01)

(52) U.S. Cl.
CPC .... *H01L 29/78615* (2013.01); *H01L 27/1203* (2013.01); *H01L 29/78612* (2013.01); *H01L 29/78618* (2013.01); *H01L 29/78639* (2013.01); *H01L 29/78648* (2013.01); *H01L 29/78696* (2013.01)

(58) Field of Classification Search
CPC ......... H01L 29/78615; H01L 29/78639; H01L 29/78612; H01L 29/78648; H01L 29/78618; H01L 29/78696; H01L 27/1203
See application file for complete search history.

(56) References Cited

U.S. PATENT DOCUMENTS

| | | | |
|---|---|---|---|
| 5,185,280 A | 2/1993 | Houston et al. | |
| 5,841,170 A * | 11/1998 | Adan | H01L 29/78696 257/345 |
| 6,090,648 A * | 7/2000 | Reedy | H01L 21/86 257/E21.004 |
| 6,204,534 B1 * | 3/2001 | Adan | H01L 27/1203 257/347 |
| 6,732,334 B2 * | 5/2004 | Nakatsuka | H01L 27/0207 716/50 |
| 8,354,714 B2 * | 1/2013 | Chen | H01L 29/458 257/336 |
| 2004/0142515 A1 * | 7/2004 | Assaderaghi | H01L 29/66772 438/149 |
| 2009/0280582 A1 * | 11/2009 | Thijs | H01L 27/0248 438/14 |

* cited by examiner

*Primary Examiner* — Michael C Zarroli

(57) ABSTRACT

Device architectures for a Silicon-On-Insulator Metal-Oxide-Semiconductor-Field-Effect-Transistor (SOI-MOSFET) were defined. They incorporated configurations of Body-Tied-Source that drastically increased the conductance that an Impact-Ionizations current sees from the body of an SOI-MOSFET. This consequently permitted the SOI-MOSFET to effectively operate at far higher operating biases.

1 Claim, 10 Drawing Sheets

- Non-optimal Design -

- Optimal Design -
Higher WGeff for a same footprint area of
total peripheral Layout $$\sigma\_Pocket \cong (q \times \mu_h \times NA) \times \frac{Wp \times tsi \times 2}{SPAC}$$

- WGeff = 2xNxSPAC/2
- N = 4; N is the number of BTs stripes

- WGeff = (N−1) × SPAC
- N is the # of BTS stripes $4 \times \sigma_{P\_Pocket} = (q \times \mu_h \times NA) \times \dfrac{Wp \times tsi}{SPAC} \times 4$ $\sigma_{P\_Pocket} \approx (q \times \mu_h \times NA) \times \dfrac{Wp \times tsi}{SPAC}$

- WGeff = (N-1)xSPAC
- N = 4, is the # of BTS stripes

APPROACH FOR AN AREA-EFFICIENT AND SCALABLE CMOS PERFORMANCE BASED ON ADVANCED SILICON-ON-INSULATOR (SOI), SILICON-ON-SAPPHIRE (SOS) AND SILICON-ON-NOTHING (SON) TECHNOLOGIES

CROSS REFERENCE

In reference to Parent application Ser. No. 14/821,685 filed on Aug. 7, 2015, tied to an international PCT Application number: PCT/US2016/000065 (WO 2017/027060).

BACKGROUND OF THE INVENTION

Complimentary-Metal-Oxide-Semiconductor (CMOS) circuits designs based on the advanced Silicon-On-Insulator (SOI) technology are continuously proving to be better match to Gallium-Arsenide (GaAs) for the compact Radio-Frequency (RF) building-blocks. CMOS can be very densely integrated into Chips that it is the only known technology today that can monolithically integrate the RF modules and Power-Amplifiers (PAs) with the digital basebands. Such integration of RF transceivers and baseband processors in one compact chip is already gaining wide momentum as its demand in the industry is continuing to increase with the continuous growth of the High-Speed Downlink Packet Access (HSDPA)-enabled networks, and the continuous requirements for higher data throughput. This is simply due to the continuous on-going scale-up of the multimedia Cellular applications and that are only projected to further increase with the recent surge of the Internet-Of-Things (IOT). Yet much of the reason that is still impeding the implementations of the conventional CMOS into the mainstream PAs and other RF modules is their relatively lower currents and reduced bandwidths as compared to GaAs devices. These GaAs devices profit from a higher carrier Mobility that is boosting their currents and their bandwidths. The Fully-Depleted Silicon-On-Insulator (FD-SOI) MOS offers an excellent suppression of the junction capacitances, and has an inherently lower Threshold-Voltage (VT) as compared to the conventional MOS on bulk substrates. This gives it the good leverage it needs in current and in bandwidth against the less matured GaAs technology. CMOS based on SOI can realize speed and bandwidth based on this suppression of the junction capacitances with a Buried-Oxide film (BOX). Additionally, this same suppression of the junction capacitances suppresses the junction leakage and results in reduced overall parasitic power consumption.

One major obstacle and that is the Floating-Body-Effect (FBE) is still issue that is preventing this SOI MOS from scaling to larger peripheries to meet requirements for the high currents that the analog RF Cellular PAs require. These requirements were well described by Ted Johansson, Senior Member, IEEE, and Jonas Fritzin, Member, IEEE, "A Review of Watt-level CMOS RF power amplifiers", *IEEE Transactions on Microwave Theory and Techniques*, vol. 62, iss. 1, pp. 111-124, December 2013. This obstacle arises simply because both, higher Drain biasing (VD) and higher device current ($I_{Device}$) increase the undesired Impact-Ionizations current (II-current) that governs the FBE, and structures with large peripheries do naturally deliver higher currents in proportion to the size of their "effective" Gate-Widths (WGeff). Accurate model for Impact-Ionizations current was described by X. Gu, G. Gildenblat, G. Workman, S. Veeraraghavan, S. Shapira and K. Stiles, "A Surface-Potential-Based Extrinsic Compact MOSFET Model", *Technical Proceedings of the* 2003 *Nanotechnology Conference and Trade Show*, vol. 2, pp. 364-367, San Francisco, February 2003.

The physical mechanism that governs the FBE was well detailed by Vandana B., "Study of Floating Body Effect in SOI Technology", *International Journal of Modern Engineering Research*, vol. 3, iss. 3, pp. 1817-1824. June 2013. FBE is mostly inherent to the SOI N-type MOS (NMOS) device and it manifests itself in Partially-Depleted Silicon-On-Insulator (PD-SOI) NMOS with build-up of positively charged Holes in P_Body that are generated from Impact-Ionizations at the Drain's edge of the device and which, for fixed Gate bias, continue to accumulate with increasing Drain Supply-voltage till they sufficiently lower the barrier under the channel between P_Body and Source and start to abruptly diffuse to Source causing an up-tick of the $I_{Device}$. This can latch-up the built-in parasitic Bipolar structure from which the device will no longer turn-off, even after the Gate voltage is brought back to values lower than VT. This up-tick of current (or the "kink-effect", as is often referred to in technical literatures) is totally undesirable as it causes a distorted linearity of the RF PAs, a degraded overall device performance, a reduced signal-to-noise ratio, and can result in false outputs from Logic Gates. While this kink-effect is generally absent in the more advanced FD-SOI NMOS, because this device operates with its Body/Source barrier already lowered due to the inherent full-depletion of its Body, it still does exhibit the Bipolar latch-up and is more susceptible to it since it takes less Impact-Ionizations current to more strongly forward-bias an already lowered barrier. This FBE mechanism is therefore the source of the obstacle that is preventing the scaling of SOI CMOS to larger peripheries. This is due to the resulting effect from the high Impact-Ionizations current in these structures that results from their high bias and the scaling of their $I_{Device}$ on further lowering their Body/Source barriers and latching the parasitic Bipolar.

The use of multi-legs (or multi-fingers) designs that decompose a large-periphery structure into dozens or potentially hundreds of paralleled transistors of smaller Gate-Widths may deliver the desired high $I_{Device}$ while still suppressing the FBE due to much lower II-current per leg (or per finger) that is in turn due to the lower magnitude of $I_{Device}$ per leg. Such large-periphery multi-legs designs are however well known to substantially increase the parasitic capacitances and reduce the device bandwidth. Their impact on increasing parasitic capacitances and reducing bandwidth in conventional MOS was well evidenced and reported by Kwangseok Han, Jeong-hu Han, Minkyu Je and Hyungcheol Shin, "RF Characteristics of 0.18-µm CMOS Transistors", *Journal of the Korean Physical Society*, vol. 40, no. 1, pp. 45-48, January 2002. The device bandwidth was shown in this work to dramatically collapse in proportion to the increase of the total number of its paralleled legs. Its ft collapsed from 80 GHz to 55 GHz with the increase of the number of its paralleled legs for same WGeff from 20 legs to 160 legs. This is attributed to the increases of the parasitic Gate-to-Body, Gate-to-Source, and Gate-to-Drain capacitances with this increase of the total number of paralleled legs. Multi-legs large peripheries MOS designs based on the SOI can be no exception to a similar trend, simply because of a similar increase of their parasitic capacitances. Furthermore, it was specifically shown that the use of multi-legs designs based on FINFETs does further amplify this reduction of the device bandwidth. That is simply because of the three-dimensional nature of the FINFET that tends to inherently increase its parasitic capacitances. Comparative assessments between planar SOI MOS and FINFETs clearly demonstrated this effect on the device performance. These assessments were carried by Jean-Pierre Raskin, "SOI Technology: An Opportunity for RF Designers?", *Journal of telecommunications and Information technology*, no. 4, pp. 3-17, April 2009; and by J. Borremans, B. Parvais, and M. Dehan, "Perspective of RF Design in Future Planar and FINFET CMOS", *Radio frequency Integrated Circuits Symposium*, pp. 75-78, Atlanta Ga., 2008. Therefore, while FINFET complies with the downscaling requirements of the ITRS for logic operations (Ion/Ioff) its potential in the analog RF appears less promising. Furthermore, past advancements in low-power FD-SOI MOS reported already on FINFET-like performance and better energy-efficiency from this device at 28 nm-like cost for logic modules and Static-Random-Access-Memories (SRAMs), and with well-defined roadmap scaling its Gate pitch down to 7 nm. These were reported by Faynot et. al., "Planar Fully depleted SOI technology: A powerful architecture for the 20 nm node and beyond", In Proceedings of 2010 IEEE International Electron Devices Meeting, December 2010. This therefore makes the FD-SOI best known technology to date that can best integrate monolithically the digital basebands and the RF for best applications into the multimedia Cellular applications and the Internet-Of-Things. Beyond this 7 nm node, FD-SOI can still lead the integrations of baseband processors and RF transceivers in monolithic 3-Dimensional Integrated-Circuits (ICs) thanks to its Ultra-thinned Silicon film (can be as thin as 3 nm-5 nm) and its Ultra-thinned buried dielectric (e. g. BOX) that can be as thin as 5 nm-7 nm. Both, the ultra-thinness of Silicon films (or sheets) and the ultra-thinness of buried dielectric can permit high-rise full monolithic Skyscraper-style vertical stacking of ICs.

Higher current devices are also as important for low insertion-loss RF-switches, and for an enhanced overall performance on all the analog and digital ICs.

Based on the above, a best approach to achieve the desired high $I_{Device}$ and high bandwidth for the analog RF PAs based on SOI CMOS would be through the incorporation of planar designs that are totally free of FBE and utilize largest possible Gate-width per leg so to maximize the bandwidth. This may totally eliminate the need for multi-legs designs, or when extreme high currents are still essentials, it can still minimize the total number of legs required to meet the target device current while still boosting the bandwidth. The larger is the Gate-width per leg, the less paralleled legs will be required to meet the target $I_{Device}$, and consequently, the higher can become the operational bandwidth. Still, and as was already discussed, due to their high current per leg (or per finger), single-legged large peripheries SOI MOS structures that incorporate a large Gate-width per leg do still suffer from FBE and Bipolar current latch-up especially when they are biased with high supply-voltages (VD≥3V) to meet wattage output requirements for handheld Cellular's as this further amplifies their Impact-Ionizations current (II-current). Again, this is simply because of the fact that not only the WGeff in SOI-based CMOS dictates the amount of II-current that governs the FBE, but also the magnitude of its Supply-voltage (VD) and that of its Front-Gate bias (VGS). These devices that require such high supply-bias (VD≥3V) typically encompass longer Gate-Lengths so to accommodate this high voltage to their Drains. Some IC modules that include such longer Gate devices include those intended for Cellular RF PAs and some other analog modules such as RF-switches, regulators and power-management ICs.

The most effective technique that is in use today to circumvent this kink-effect and the Bipolar current latch-up in planar single-legged SOI MOS, is through the incorporation of a Body-Tied-Source (BTS) within the Device layout. This BTS consists of no more than highly doped region(s) within the device layout structure, that is/are doped counter to the doping of the Source and Drain, and that is/are typically wired to the Source with Nickel- or Cobalt Silicide. This BTS allows the bulk of the II-current in the device Body to sink-out to it. It reduces therefore the current from Holes in an NMOS that can diffuse from Body to Source and latches the parasitic Bipolar structure. The pitfall of this technique is that it reduces the WGeff of the device for a given full peripheral width (WG) of device structure and consequently the $I_{Device}$. This is simply because the Silicon volume consumed by BTS does not contribute to device current. The capability of a BTS to reduce this Bipolar current gain in FD-SOI MOS was demonstrated by K. Hirose, H. Saito, S. Fukuda, Y. Kuroda, S. Ishii, D. Takahashi, and K. Yamamoto, "Analysis of Body-Tie Effects on SEU Resistance of Advanced FD-SOI SRAMs Through Mixed-Mode 3-D Simulations", *IEEE transactions on Nuclear Science*, vol. 51, no. 6, pp. 3349-3353, December 2004. FIG. 1 illustrates this fact in showing side by side two comparative layout schematics of SOI-based NMOS structures and same WG: One optimized layout (right-hand side) that is capable of suppressing FBE for given bias with minimum area consumed by BTS. And, another un-optimized layout (left-hand side), of same full peripheral width (WG), that used extra BTS area that is not actually needed to suppress the FBE for same bias. The optimized layout gives higher WGeff, and does correspondingly give superior device performance manifested with higher current for same bias and same peripheral footprint; it is more area-efficient.

As more large-periphery devices get integrated monolithically to form functional ICs, summative or total combined parasitic area from BTS alone can become substantially large. Consequently, a tremendously large die-size can result unless area consumed by BTS within each single MOS device gets minimized relative to the device targeted performance (optimizing the performance for area-efficiency). The other alternative would be to rely on devices built with hundreds or potentially thousands of multi-legs structures of narrower Gate-widths (≤0.5 μm) having no BTS; however and as was stated already, this causes severe hit on the bandwidth.

If for instance through effective optimization, a1 μm² of BTS area in an SOI NMOS gets reduced by 40%, the device will benefit from gaining 40% increase in its drive current for same WG. Conversely, this WG can be reduced by 40% for a same drive current. In an IC containing 200 SOI NMOS, a corresponding 80 μm² reduction in its total peripheral layout would then result for same or better performance. These are serious improvements in area-efficiency and in performance that cannot be overlooked.

Similar to SOI, Silicon-On-Sapphire (SOS) utilizes Sapphire ($Al_2O_3$) as its buried film instead of BOX to suppress the junction capacitances. The Silicon-On-Nothing (SON) process on the other hand allows the buried dielectric, which may still be a dielectric but can also be an air gap, to locate only underneath the Gate and possibly also under the spacers regions of the device. It can still maintain the desired coupling between the Front-Gate and the Back-Gate (a "must" criterion in FD-SOI MOS). The "claimed" advantage of this SON structure over SOI and SOS can be in its reduced series resistance, and in its lessened self-heating due to less volume consumed by BOX or sapphire. Both of these two technologies, the SOS and the SON, are equally susceptible to the FBE, and both do possess the exact same obstacle as SOI to the scalabilities of their devices to larger peripheries.

BRIEF SUMMARY OF THE INVENTION

The invention forces a distinctive functionality in new and innovative device structures for single-legged SOI MOS that ensures their operation at any high bias (below Breakdown) through an adequate suppression of the effects of their built-in parasitic Bipolar structures, and with best area-efficient layouts (minimized total area consumed by BTS relative to the device targeted performance). This functionality is fully scalable to the single-legged structures of very large peripheries that operate at very high currents and high supply-voltages (VD≥3V) and that consequently inject higher II-currents.

This distinctive functionality is realized through specifically designing (or constructing) between Body (P_Body in case of an NMOS) and the BTS a highest possible conductance that can correspondingly filter to BTS highest possible II-current. This consequently results in lowest possible voltage-drop (Vdrop) between the Body and the BTS from this II-current. This allows the device to operate at its highest possible bias without activating or latching its parasitic Bipolar current. Also it can similarly operate at its highest possible bias while it can effectively filter-out the induced ionizations from Single-Event-Effects (SEE's) that can be caused from the Cosmic rays/particles striking the sensitive Silicon volume of the device. Note that even a small Silicon volume can become susceptible to SEE's at the high biases (VD≥3V).

This high conductance between P_Body and BTS is in turn constructed with a very highly P-doped pocket (in case of an NMOS) in the Silicon under the Gate region and that interfaces on its one side the full peripheral width of the device structure while it junctions the Source on its opposite side. The higher doping of this pocket (P_Pocket) relative to P_Body imposes hard barrier for II-current in P_Body to laterally diffuse through this junction and forces it to trap and conduct instead through this P_Pocket along the much wider WG that optimally connects to specific configurations of very narrow stripe(s) of BTS to result in this highest conductance between P_Body and BTS that the II-current sees. The very narrow stripe(s) of BTS is/are essential for area-efficiency as the Silicon volume from BTS does not contribute to device current. These BTS stripes can either incorporate corner-rounding while they connect to the P_Pocket or can be fully rectangular as in FIG. 1. Corner-rounding can alleviate the effect from current-crowding in P_Pocket as the II-current converges to the BTS.

It is applicable to both the FD-SOI, and the PD-SOI. It is totally valid for SOS and SON as the physical mechanism to this distinctive functionality confines only to the top Front-Silicon surface of the device. It is fully scalable with varying peripheral Gate-widths, and with varying Gate-lengths. It was validated with TCAD simulations and was experimentally tested on a 0.18 μm-CMOS process.

Related findings were presented at the 2015 IEEE Topical Symposium on Power Amplifiers for Wireless Communications in San Diego, Calif. Conference was hosted at the University of California San Diego (UCSD).

BRIEF DESCRIPTION OF THE SEVERAL VIEWS OF THE DRAWINGS

FIG. 2 B: Schematic illustrating the conductive path for Impact-Ionizations current in the device structure of FIG. 2 A.

FIG. 3 B: "Cartoon" schematic showing the Side view from the Source side of the same claimed architecture of FIG. 2 A based on either the SOI or the SOS.

FIG. 3 C: "Cartoon" schematic showing the side view from the Drain side of the same claimed proprietary architecture of FIG. 2 A based on either the SOI or the SOS.

FIG. 6 B: Schematic illustrating the conductive path for Impact-Ionizations current in the device structure of FIG. 6 A.

FIG. 7 B: "Cartoon" schematic showing the Side view from the Source side of the same claimed architecture of FIG. 6 A based on either the SOI or the SOS. (The side view from the Drain side is same as that of FIG. 3 C).

Key concept in our guided design approach is that it maintains for the targeted (desired) electric specifications such summative total area consumed by BTS to a very minimum while effectively suppressing the FBE.

Figure 6:
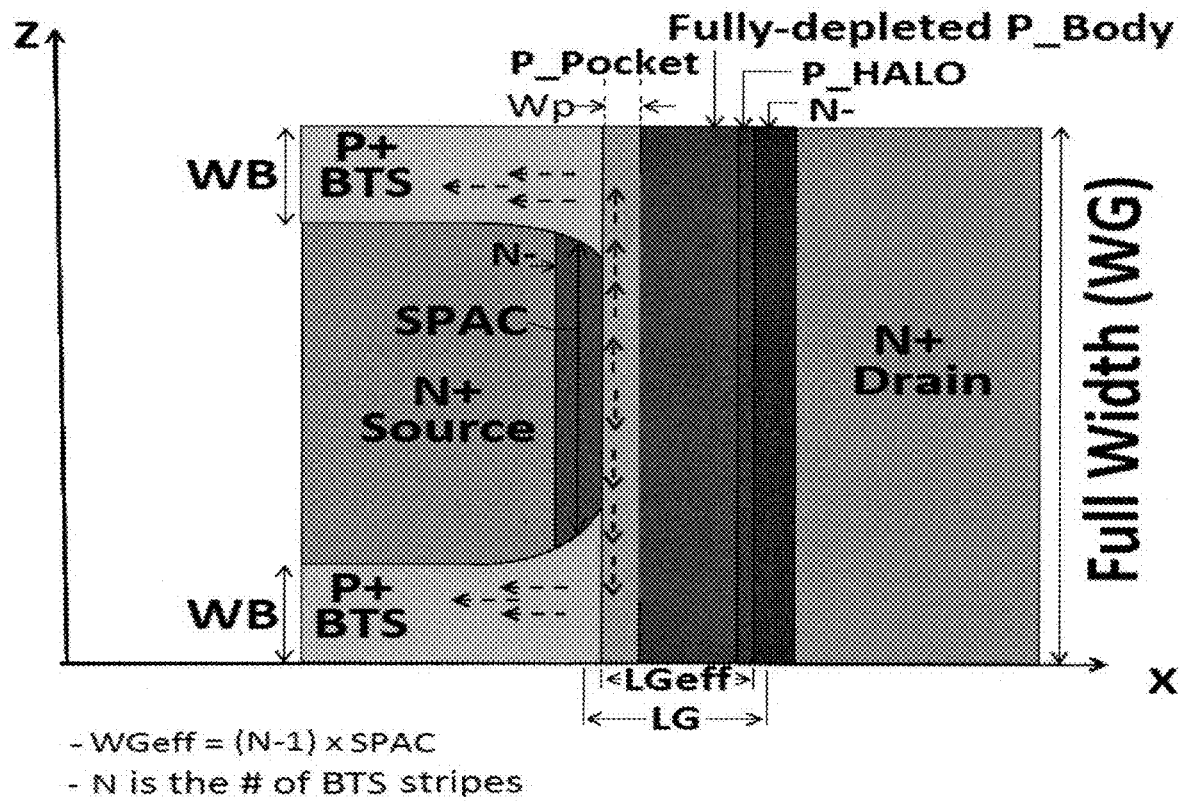
FIG. 6 A: Top view schematic of another proprietary single-legged SOI-NMOS device that is also being claimed in this patent. It similarly splits the Impact-Ionizations current through P_Pocket into two paralleled paths that ensure similar highest conductance that this Impact-Ionizations (II-current) sees between the P_Body and BTS for given WG. Its minor drawback compared to the layout of FIG. 2 A is that it requires one additional BTS stripe for a same WGeff. Gate, its dielectric, and Spacers regions are not shown. Gate and its dielectric are shown in the side views of FIG. 7 A and FIG. 7 B.
Figure 6:
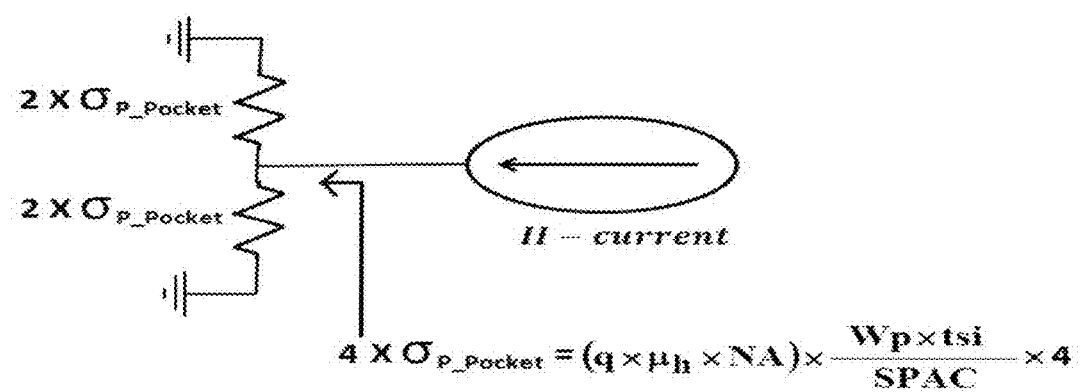
Figure 11:
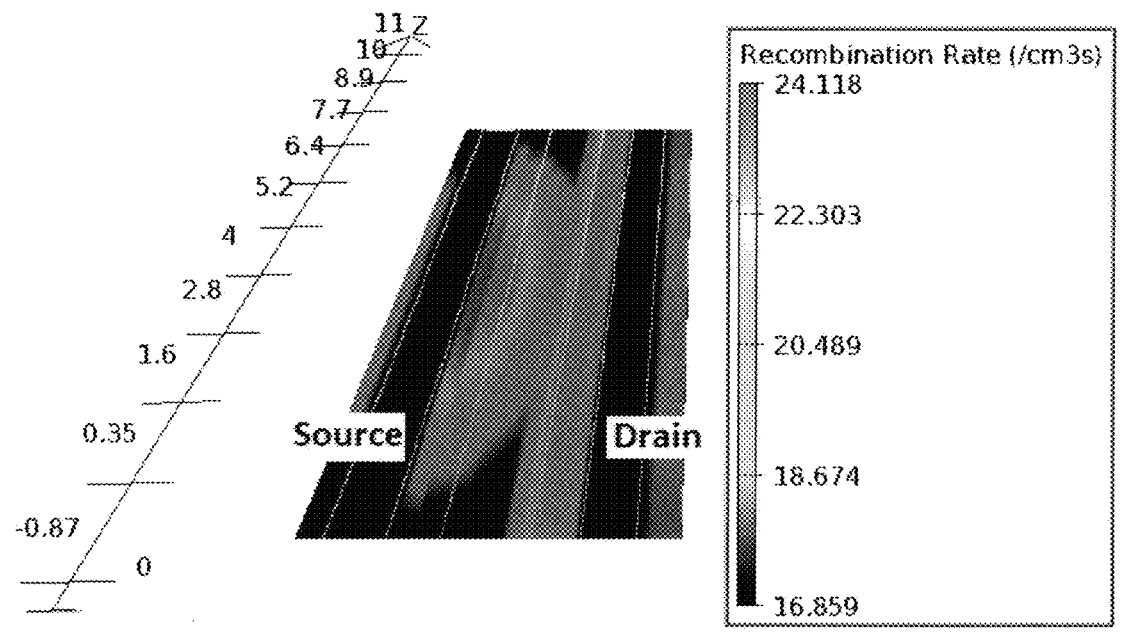

FIG. 11: A 3D TCAD simulation illustrating the parasitic Bipolar latch-up in an un-optimized large-periphery 1-leg FD-SOI NMOS based on the device structure of FIG. 6 A. Shown is $LOG_{10}$ of the Recombination Rate. As shown, Diffusion current is strongest toward the center between 2 BTS where the voltage-drop in P_Pocket due to the conducting Holes from Impact-ionization is highest, and so is the barrier lowering.

Figure 12:
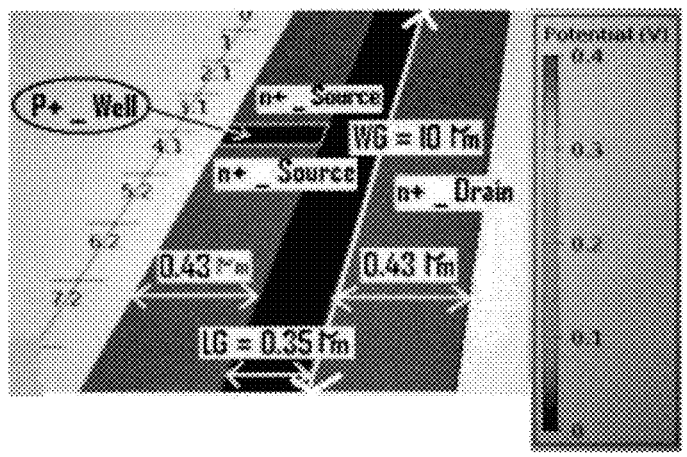

FIG. 12: Simulation of the Body potential in a fully optimized large-periphery 1-leg FD-SOI NMOS. It exhibited less than a 0.1V throughout its P_Body. The device was optimized in the back-accumulation mode (with an applied negative bias to its Back-Gate, in addition to the positive bias for inversion at the Front-Gate). These boosted further the conductance that the Impact-Ionizations current sees between the P_Body and the BTS. WB=0.5 μm.

Figure 13:
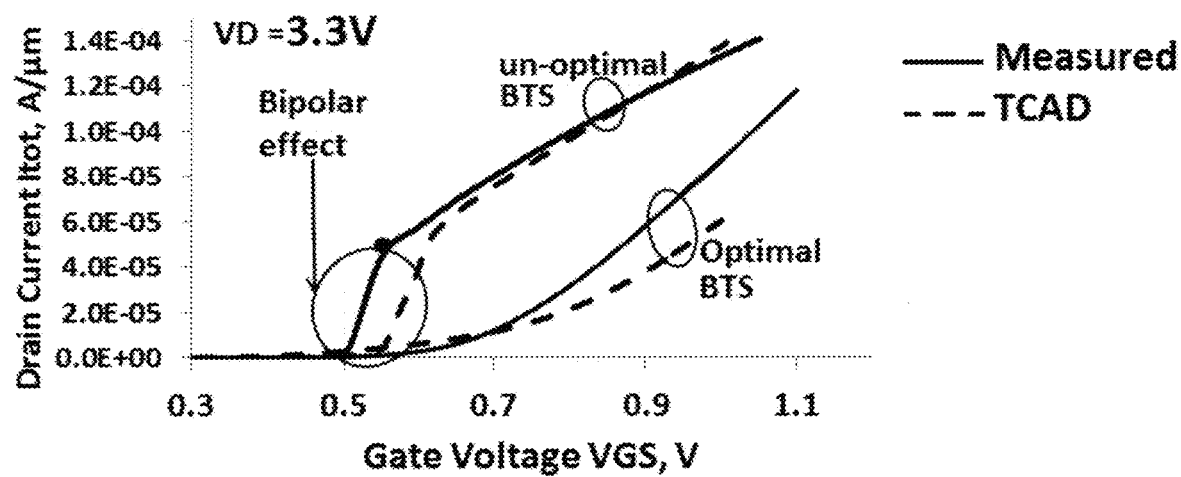

FIG. 13: Measured and simulated Current-Voltage transfer curves of FD-SOI NMOS devices (WGeff=2 μm; LG=0.35 μm; VD=3.3V); Box=0.5 μm; CFox-10 nm; tsi=35 nm; WB=μm). Clearly shown is the Bipolar effect in a device that failed to maintain low voltage drop throughout its P_Pocket. The optimal device on the other hand effectively suppressed the Bipolar effect.

Figure 14:
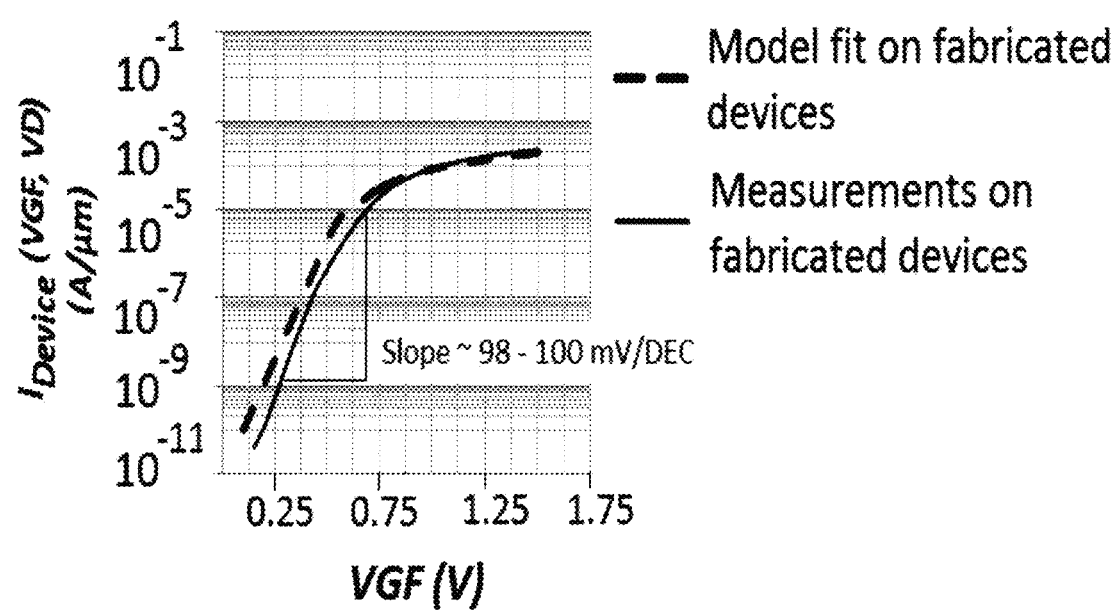

FIG. 14: Measured and simulated Subthreshold-Slope (SS), from 3D TCAD, in our optimized FD SOI NMOS (WGeff=2 μm; LG=0.35 μm; VDS=3.3V; Box=0.5 μm; tox-10 nm; tsi=35 nm). Its relatively high SS of 98 mV/Dec is caused from the effect of its highly doped P_Pocket. (Typical values for SS are: 65-80 mV/Dec with FD SOI; 80-120 mV/Dec with PD SOI; and ≥120 mV/Dec with bulk Si substrate).

DETAILED DESCRIPTION OF THE INVENTION

Figure 1:
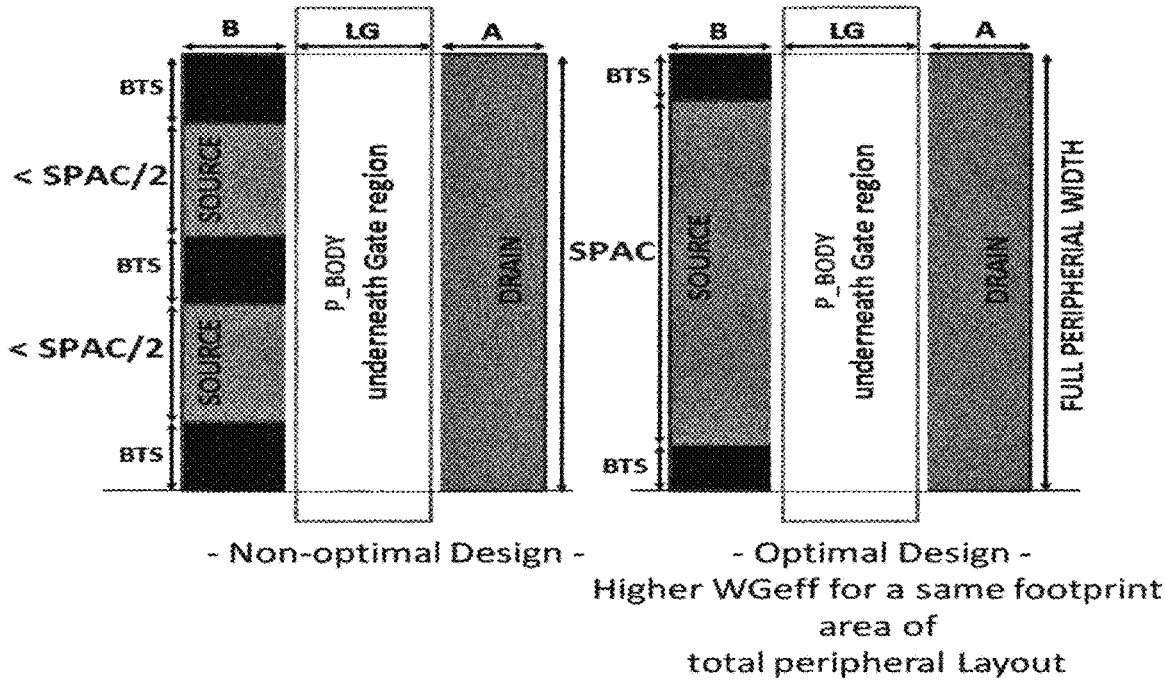
FIG. 1: Comparative "drawn" schematics illustrating the comparison between one non-optimal layout of an SOI-NMOS (left-hand side) versus an optimized layout design (right-hand side) of a same device. The non-optimal design used extra unneeded BTS area to meet targeted electric specifications with a fully suppressed FBE; the optimized design used on the other hand minimum possible BTS area for an equal suppression of FBE at same electric specifications and same total peripheral layout area. The WGeff in the optimized design is higher and so are its drive current and speed.
Figure 2:
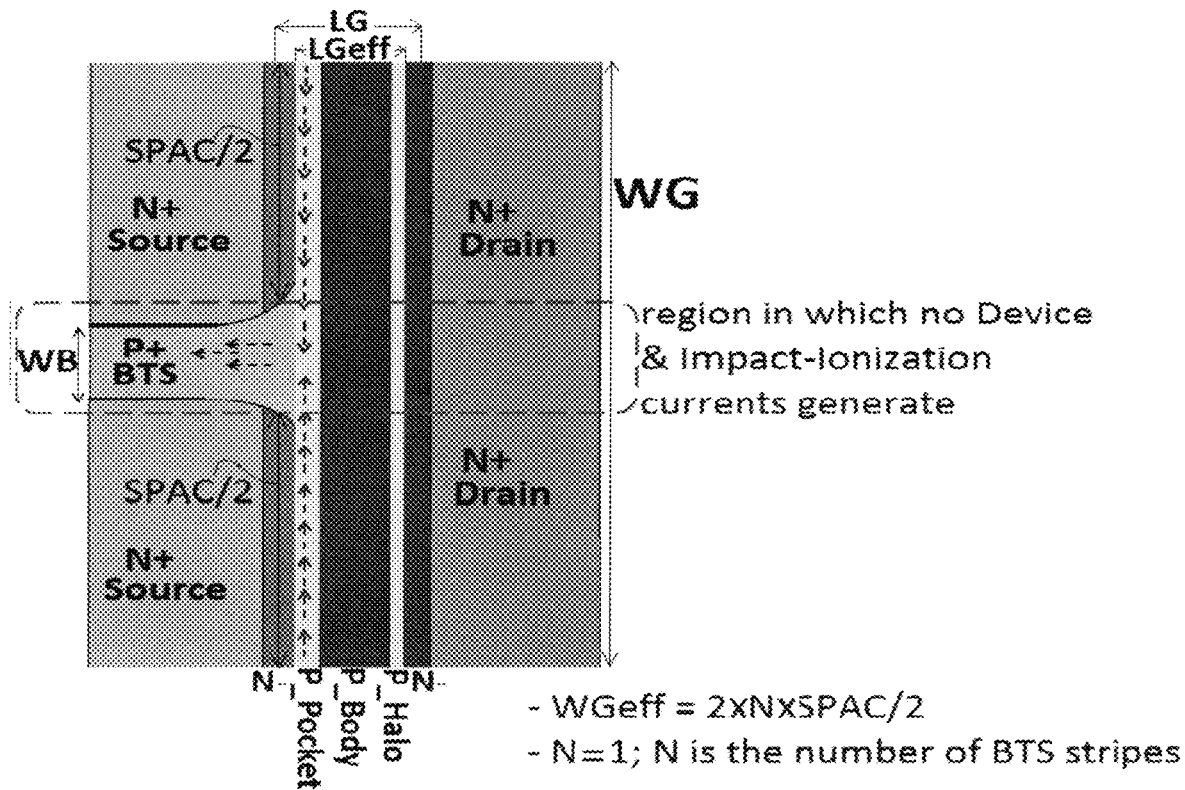
FIG. 2 A: Top view schematic of a proprietary single-legged SOI-NMOS device architecture that is being claimed in this patent. It ensures highest possible conductance between P_Body and BTS that the Impact-Ionizations current (II-current) sees for given device periphery layout. This highest conductance is realized through the implantation of very highly conductive channel or canal (P_Pocket) that interfaces on its one side the full peripheral width of the device structure while it junctions the Source on its opposite side. This higher doping of this pocket (P_Pocket) relative to P_Body imposes hard barrier for II-current in P_Body to laterally diffuse through this junction and forces it to split instead into paralleled paths and conduct to the narrow BTS stripe through this P_Pocket along the much wider WG. These paralleled paths for II-current increase the equivalent conductance between P_Body and BTS for given WG. A narrow BTS stripe width (WB) is essential for area-efficiency as the Silicon volume consumed by BTS does not contribute to device current. Smooth corner-rounding of the BTS edges can suppress current-crowding and boost the equivalent conductance. The BTS stripes can also be fully rectangular as in the FIG. 1. Gate, its dielectric, and Spacers regions are not shown. Gate and its dielectric are shown in the side views of FIG. 3 A, FIG. 3 B, and FIG. 3 C that further describe this same singled-leg SOI MOS device structure. The "LG" symbolizes the Gate-Length.
Figure 2:
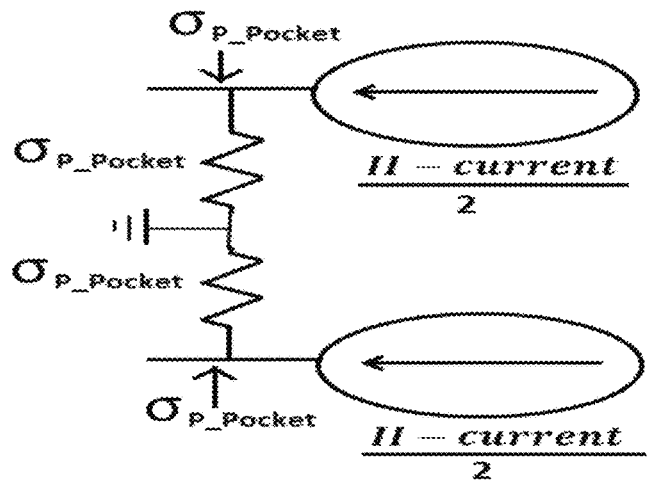
Figure 3:
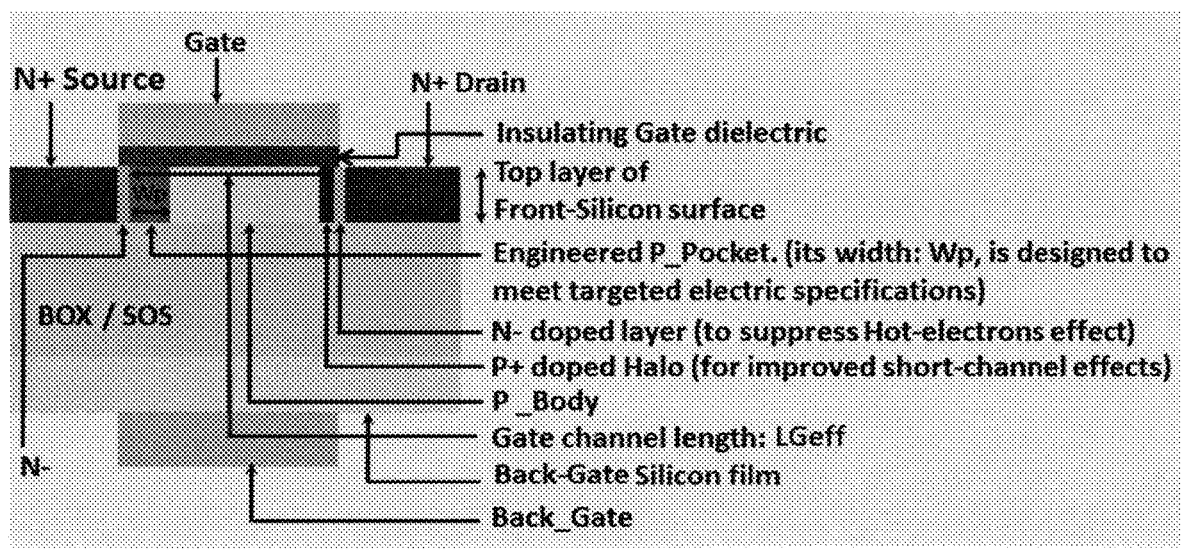
FIG. 3 A: "Cartoon" schematic showing the corresponding Front view of the same claimed proprietary architecture of FIG. 2 A based on either the SOI or the SOS. The spacers on both lateral ends of the Gate are not being shown; they can be same as in any standard CMOS process. (Back view is similar).
Figure 3:
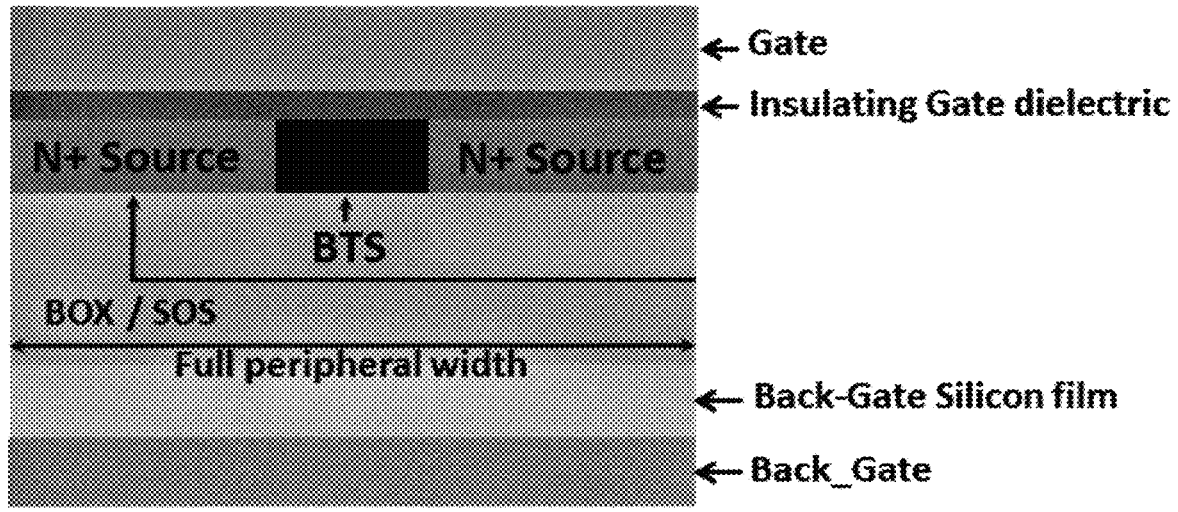
Figure 3:
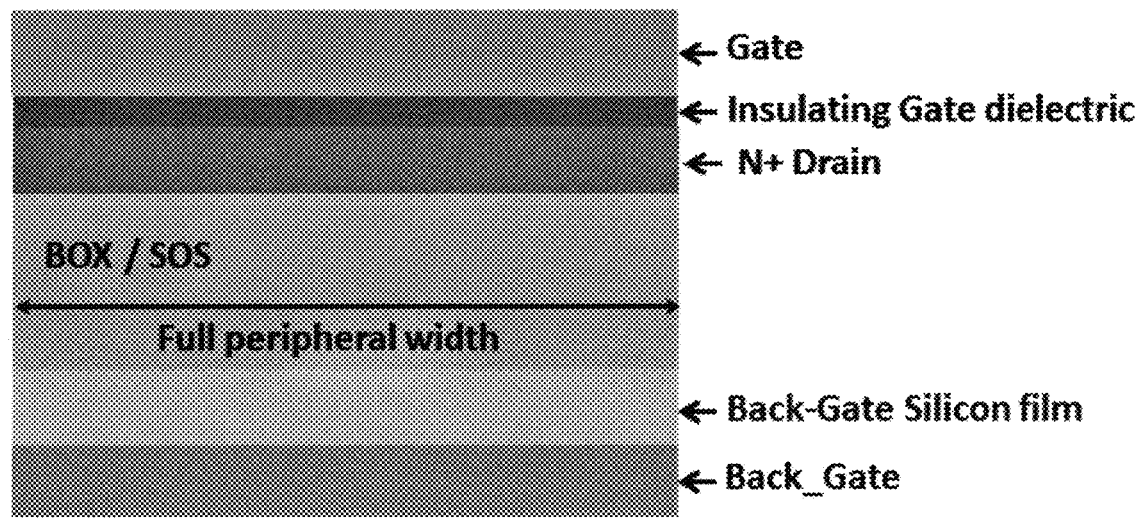

A top-view of such device layout is depicted in FIG. 2 A. Further schematics describing its structures are shown in FIG. 3 A, FIG. 3 B, and FIG. 3 C. The P_Pocket extends from the Source into the "effective" Gate-Length of the device (LGeff) a distance: Wp that is a relatively small fraction of LGeff so to ensure the P_Pocket is conductive enough and with no or little penalty on the device VT. A tighter or a more loose constraint on Wp may always be set for the specific application. As is shown with the dashed-arrows in FIG. 2 A, the device structure splits the II-current that generates around its Drain's edge into two equal magnitudes that converge through separate paths to the BTS while conducting in P_Pocket alongside the Gate-width of the structure. FIG. 2 B shows an equivalent circuit diagram depicting the flow of Impact-Ionizations current (II-current) to the BTS. The dashed-rectangle in FIG. 2 A shows region within the device structure that does not conduct device current, and no consequent Impact-Ionizations occur either within it in following the II-current model described by X. Gu et al.:

$$II-\text{current} = I_{Device} \times \left[\frac{\alpha}{\Omega} \times (VD - \Gamma \times Vknee) \times e^{-\frac{lm \times \Omega}{VD-\Gamma \times Vknee}}\right] \cdot \alpha,$$

$\Omega$, lm and $\Gamma$ are parametrization constants. A lateral device current must conduct through this dashed-rectangle region of FIG. 2 A to kick Impact-Ionizations and it does not. This also reduces the portion from WG that conducts device current to WGeff=2×N×SPAC/2=SPAC (N is the number of narrow stripes used for BTS. N=1 in FIG. 2 A). WB is the width of the very narrow BTS stripe(s) that interface(s) the P_Body along the WG. As is intuitive from the above equation, the II-current does increase with WGeff since the $I_{Device}$ increases with WGeff. Part of the II-current conducts through this P_Pocket while its other part leaks through the lateral junction between Body and Source. The corresponding equation for the currents-balance from Kirchoff-Current-Law (KCL) is:

$$\frac{II-\text{current}}{2 \times N} = \frac{I_{Bipolar}(Vdrop)}{2 \times N} + Vdrop \times \sigma_{P\_Pocket}.$$

Vdrop is the voltage-drop in P_Pocket from the portion of II-current that conducts through it. $\sigma_{P\_Pocket}$ is the conductance of P_Pocket on each side of the BTS. Its analytic model from simple device Physics is:

$$\sigma_{P\_Pocket} = \frac{1}{\rho} \times \frac{area}{length} = (q \times \mu_h \times NA) \times \frac{Wp \times (tsi - Deplmax) \times 2}{SPAC} \quad (1)$$

q is the electron-charge unit, tsi is the thickness of the Silicon film, $\mu_h$ is the Hole-Mobility in P_Pocket, and NA is the doping concentration in this P_Pocket. The II-current splits into two parallel paths to BTS and scales the equivalent conductance between P_Body and BTS to:

$$2 \times N \times \sigma_{P\_Pocket} = 2 \times \sigma_{P\_Pocket}.$$

The above expression for $\sigma_{P\_Pocket}$ does not account to the effect of lateral depletion in P_Pocket since a lightly doped region at Source (N−) absorbs most of this junction depletion. The expression still accounts nonetheless to the impact from the transversal depletion in P_Pocket while assuming the extreme scenario that P_Pocket strongly inverts. Expression for this transversal depletion is:

$$Depl\max = 2 \times \sqrt{\frac{\varepsilon tsi \times \varphi p}{q \times NA}}, \text{ with } \varphi p = vth \times ln\left(\frac{NA}{ni}\right) \cdot \varepsilon tsi$$

is the electric-dielectric constant of Silicon, and ni is the intrinsic carrier concentration of Silicon.

The expression for the KCL balance for currents can be rewritten as:

$$II\text{-current} = I_{Bipolar}(Vdrop) + Vdrop \times (2 \times N) \times \sigma_{P\_Pocket} \quad (2)$$

In substituting equation (1) into equation (2) it is obtained:

$$II - \text{current} = I_{Bipolar}(Vdrop) + \quad (3)$$

$$Vdrop \times (2 \times N) \times (q \times \mu_h \times NA) \times \frac{Wp \times (tsi - Depl\max) \times 2}{SPAC}$$

Equation (3) states that an equivalent conductance that the II-current sees from the P_Body of the device of FIG. 2A is: $(2 \times N) \times \sigma_{P\_Pocket} = 2 \times \sigma_{P\_Pocket}$. This compares to a conductance of:

$$\frac{\sigma_{P\_Pocket}}{2}$$

if the BTS stripe was connected instead at the very edge of the WG in FIG. 2A and with an exact same WGeff=SPAC. That is an increase by factor of 4 for same WGeff, simply from optimum positioning same BTS stripe along the WG.

Figure 5:
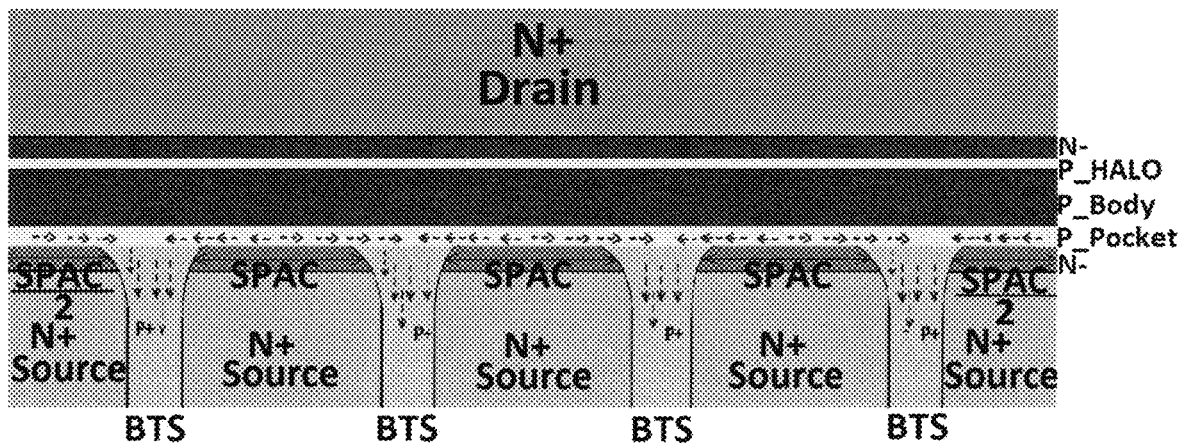
FIG. 5: An illustrative top-view layout of a larger-periphery version of the single-legged SOI-NMOS device structure of FIG. 2 A. It uses 4 BTS stripes. Its "effective" Gate width is: 4×SPAC. Gate, its dielectric, and Spacers regions are not shown.

Due to the finite magnitude of $\sigma_{P\_Pocket}$ for any given values for Wp, NA, $\mu_h$, and tsi, the structure of FIG. 2A (with N=1) cannot manage the high magnitudes of II-current from devices with very large peripheries while it still suppresses the parasitic Bipolar current. This is especially true when high VD is applied as this will further amplify the II-current. Significant Bipolar leakage will then occur. The fix is to insert more BTS stripes to scale-up the equivalent conductance between the P_Body and BTS. This will further split the II-current among more paralleled BTS stripes and scales the equivalent conductance that the II-current sees between P_Body and BTS in proportion to $(2 \times N) \times \sigma_{P\_Pocket}$. The II-current will then split by factor: $2 \times N$ and each portion of it sees a conductance $\sigma_{P\_Pocket}$, and same $$\frac{1}{2 \times N}$$

fraction from the total Bipolar leakage. A schematic for such large-periphery structure is shown in FIG. 5. With N=4, and WGeff=4×SPAC. Equivalent conductance seen from P_Body scales to $2 \times N \times \sigma_{P\_Pocket} = 8 \times \sigma_{P\_Pocket}$.

Key criterion is to maintain lowest number of BTS stripes for fixed magnitudes of WGeff, WB, tsi, Wp, and for tolerated preset magnitude for the Bipolar leakage due to II-Current at the given bias (a rule-of-thumb is to design for Bipolar leakage one to two order(s) of magnitude lower than the $I_{Device}$). This is what ensures that for given bias, best area-efficiency of layout is achieved (such that WGeff is closest to WG) and with adequate suppression of the device built-in parasitic Bipolar current.

The general procedure for the design is:

1—The required WGeff for the device to deliver its operating current target (its desired $I_{Device}$ current) at its VT and bias can be extracted from any DC model that models the MOS device current function of VT. One possible model is that described by Kwyro Lee, Michael Shur, Tor A. Fjeldly, and Trond Ytterdal, *Semiconductor Device Modeling for VLSI*, New Jersey: Prentice Hall, pp. 238-256, 1993.

2—Value for the $I_{Bipolar}$(Vdrop) is affixed to magnitude significantly lower than the $I_{Device}$ (e.g. generally one to two order(s) of magnitude lower, but may still be even lower). An accurate model for the Bipolar current is crucial to extract the corresponding Vdrop magnitude to this affixed value of $I_{Bipolar}$(Vdrop). One possible model can be that described by Ben G. Streetman, *Solid State Electronic Devices*, $4^{th}$ ed. New Jersey: Prentice Hall, pp. 244-247, 1995.

3—For the targeted (or the desired) values for VD and $I_{Device}$ the II-current is extracted for its WGeff from any accurate model that models the Impact-Ionizations current (e.g. the model described by X. Gu et al).

For the accurate extractions of all of WGeff, Vdrop, and II-current at the targeted (or the desired) VD and $I_{Device}$, the utmost accurate parametrization constants reflecting on the specific fabrication-process and layout peripheries must be utilized in the selected models that are used to model the DC MOS currents, the Bipolar leakage, and the Impact-Ionizations.

Specifically-built test-structures on test-chips (or test-vehicles) are utilized for the most accurate extractions of the parametrization constants for the models prior to using these models in the steps 1, 2 and 3 above. Test-structures can also used to extract the $\mu_h$.

The number of required stripes for BTS, that is N and the required spacing(s) between these stripes are then extracted from the system-model below:

$$II - \text{current} = \quad (4)$$

$$I_{Bipolar} + Vdrop \times (2 \times N) \times (q \times \mu_h \times NA) \times \frac{Wp \times (tsi - Depl\max) \times 2}{SPAC}$$

$$WGeff = (2 \times N) \times SPAC/2 = N \times SPAC \quad (5)$$

Daghighi et al. recognized through his work on PD-SOI MOS: Arash Daghighi, Mohamed Osman, and Mohamed A. Imam, "An area efficient body contact for low and high voltage SOI MOSFET devices", *Solid-State Electronics*, vol. 52, iss. 2, pp. 196-204, February 2008, that the insertion of many more BTS stripes reduces the Body potential caused from Impact-ionizations and can alleviate the FBE and the Bipolar latch-up, which may allow a degree of scale-up for larger WGeff's and currents. He failed to realize though that the added incorporation of very highly conductive channel/canal in the device Body, along its entire width, and that junctions the Source and ties all the BTS stripes together can dramatically reduce this Body potential to permit significant reduction of the number of BTS stripes required to maintain adequate suppression of the Bipolar effects for same bias. This would consequently result in larger WGeff and higher device current for same total peripheral footprint of layout. Such highly conductive channel/canal (P_Pocket) is doped higher than the Body and extends laterally into it. Daghighi et al. did not realize either that his same device layout is not effective for the FD-SOI MOS as the high II-current will opt to shorten to the Source through an already-lowered lateral barrier rather than to conduct to BTS through the higher resistivity of the fully-depleted Body.

Figure 4:
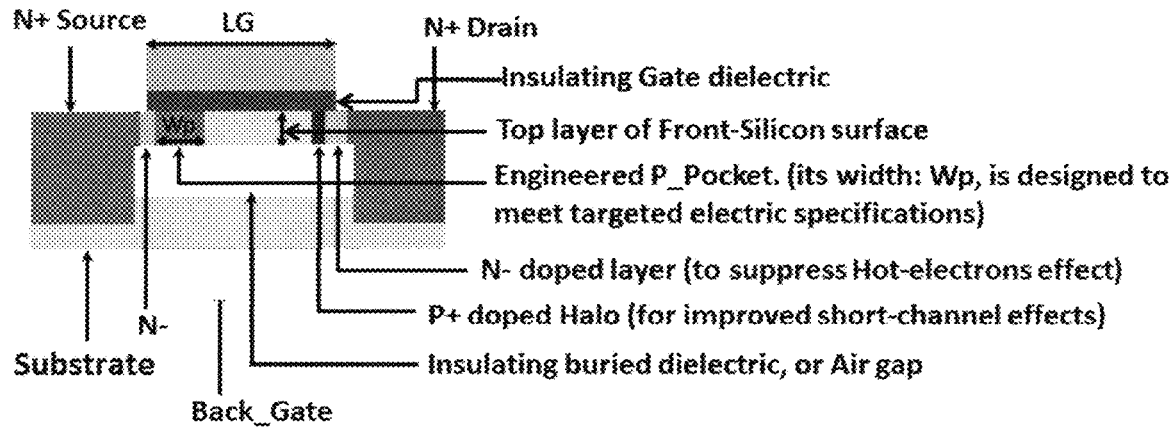
FIG. 4: "Cartoon" schematic showing the corresponding front view of the claimed proprietary architecture of FIG. 2 A, but based on SON, (the back view is similar). Its side views are similar to those of FIG. 3 B and FIG. 3 C, but with the "BOX/SOS" layer substituted with N+ Source and N+ Drain. Similarly, Spacers on both lateral ends of the Gate are not shown; they can be same as in any standard CMOS process.

Design that can be closest to the new innovative device structures that are introduced in this patent is that of U.S. Pat. No. 5,185,280 (Theodore W. Houston et al., U.S. Pat. No. 5,185,280A, FIG. 4 & FIG. 4a in U.S. Pat. No. 5,185,280A). This design accounts to the advantage of tying the BTS implant to highly doped Halo pocket, but fails to realize that for given WG there exists optimal configuration for BTS that gives highest area-efficiency (maximizes WGeff for same WG). Furthermore, the highly doped pocket (having same dopant as Body) of the device design in that U.S. Pat. No. 5,185,280 patent does not fully separate the entire Body region from the lightly doped Source region. Consequently, the area for this Pocket is low and so is its conductance, especially when thin silicon film is used (small tsi). This may require more BTS stripes to suppress parasitic Bipolar leakage for same bias (hence larger WG periphery for same device current). Also the extrinsic Source resistance that the device current of patent U.S. Pat. No. 5,185,280 sees is high.

Figure 7:
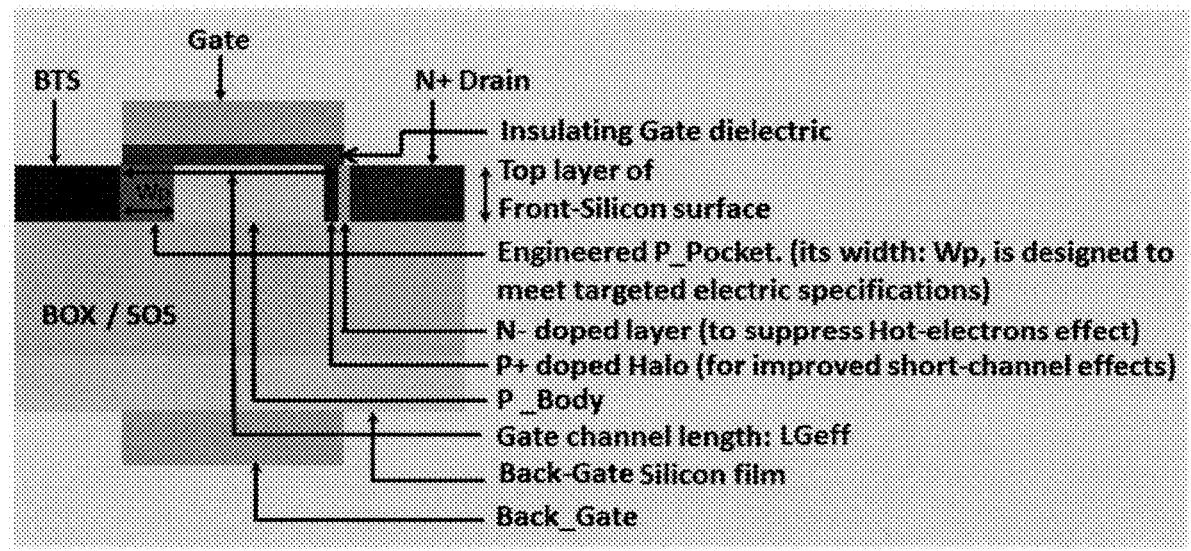
FIG. 7 A: "Cartoon" schematic showing the corresponding Front view of the same claimed proprietary architecture of FIG. 6 A based on either the SOI or the SOS. The spacers on both lateral ends of the Gate are not being shown; they can be same as in any standard CMOS process. (Back view is similar).
Figure 7:
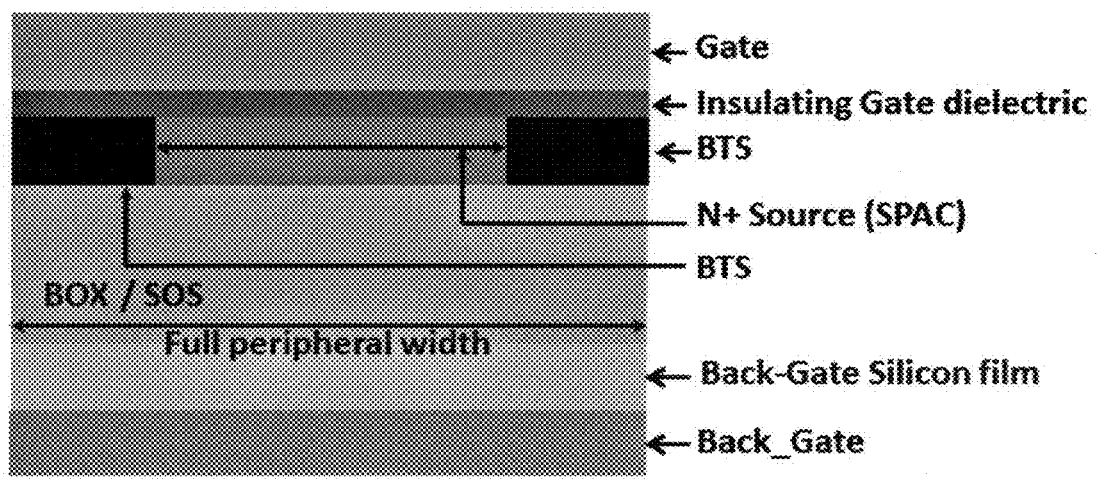
Figure 8:
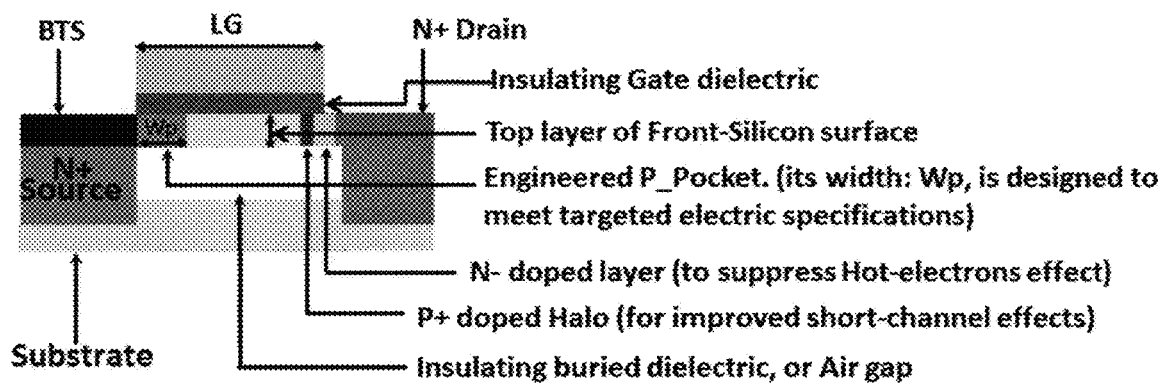
FIG. 8: "Cartoon" schematic showing the corresponding front view of the claimed proprietary architecture of FIG. 6 A, but based on SON (the back view is similar). Its side views are similar to those of FIG. 7 B and FIG. 3 C, but with the "BOX/SOS" substituted N+ Source and N+ Drain. Spacers on both lateral ends of the Gate are not shown; they can be same as in any standard CMOS process.
Figure 9:
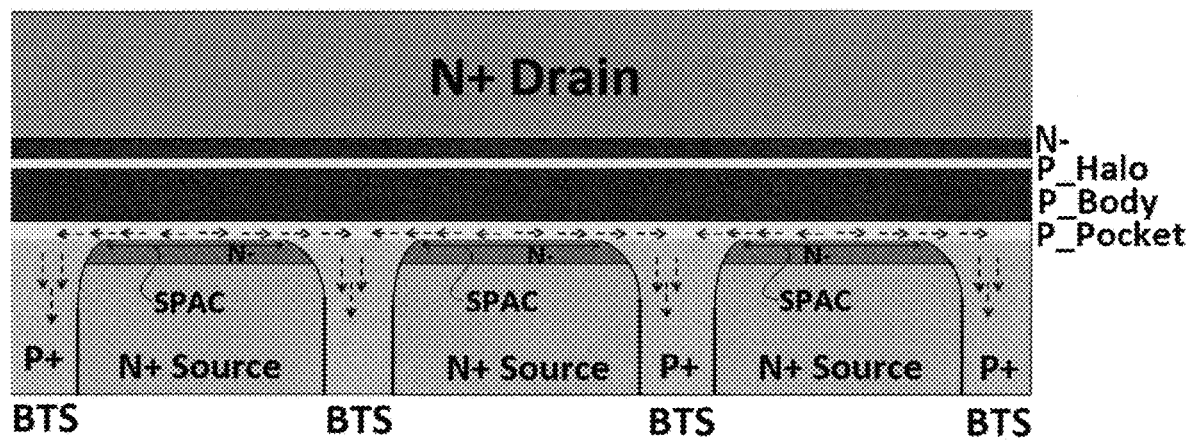
FIG. 9: An illustrative top-view layout of a larger-periphery version of the single-legged SOI-NMOS device structure of FIG. 6 A. It uses 4 BTS stripes. Its "effective" Gate width is: (4-1)×SPAC=3×SPAC. Gate, its dielectric, and Spacers regions are not shown.
Figure 10:
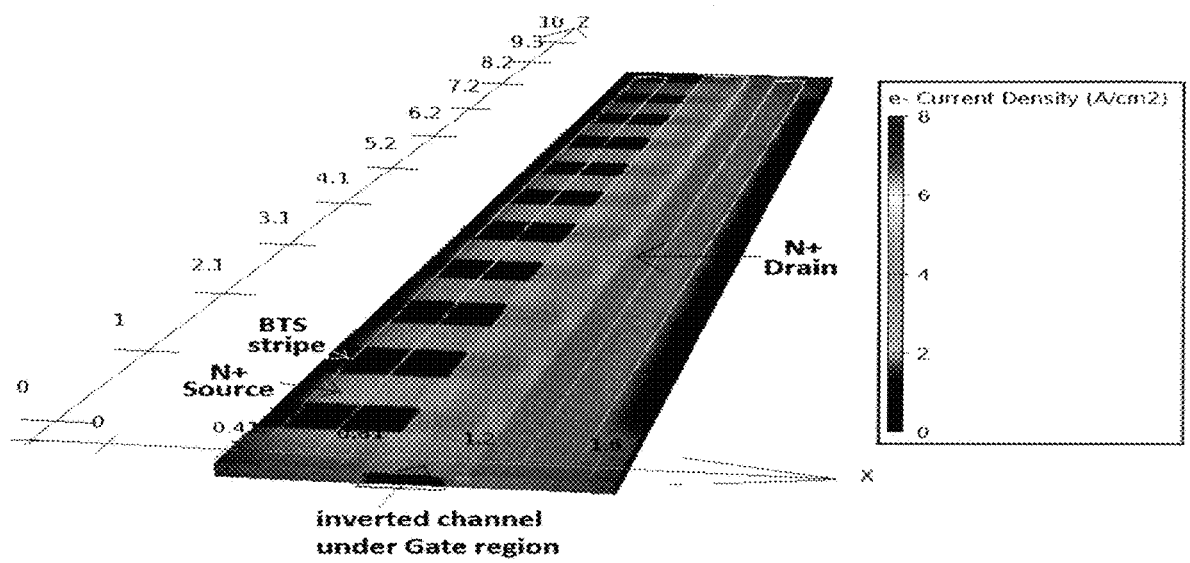
FIG. 10: A 3D TCAD simulation illustrating the impact of extra summative BTS areas on the WGeff in a large-periphery 1-leg FD-SOI NMOS. As more BTS area gets consumed within the total layout periphery of the device, the conductive path for electron current gets reduced, and therefore the effective Gate-Width (WGeff) of the device is also reduced. A total of eleven BTS stripes were utilized in that simulation.

Another proprietary device structure for singled-legged SOI-NMOS is shown in FIG. 6A, FIG. 7 A, and FIG. 7 B. It results in same equivalent high conductance between P_Body and BTS as that of FIG. 2 A, but with a different style of connecting P_Pocket to BTS. It is less area-efficient for same WG as it uses one additional BTS stripe. FIG. 9 shows a scaled-up version of its structure in which 4 BTS stripes are used (N=4. Similarly, its KCL current balance and scaling conform to the system model:

$$II-\text{current} = \qquad (6)$$
$$I_{Bipolar} + Vdrop \times (N-1) \times (q \times \mu_h \times NA) \times \frac{Wp \times (tsi - Dep/\max) \times 4}{SPAC}$$

$$WGeff = (N-1) \times SPAC \qquad (7)$$

Note that for very large N, Equation (6) approaches that of Equation (4), and Equation (7) approaches that of Equation (5).

Table 1 displays device parameters for the optimization performed on the device structure of FIG. 12 following the general design procedure described in this section. Table 2 shows the parameterization constants that were extracted from the specifically-built test-structures, and the design equations used from models Additional models were used to account to the long-channel and the short-channel VTs. Model for the long-channel VT was taken from the work of Hyung-Kyu, student member, IEEE, and Jerry G. Fossum, Fellow, IEEE, "Threshold voltage of thin-film Silicon-On-Insulator (SOI) MOSFET's, *IEEE Trans. Electron Devices*, vol. 30, no. 10, pp. 1244-1251, October 1983. And, the model to correct this VT for short-channel effects independently from the effect of II-current was derived in this work.

TABLE 1

Process Parameters and the design optimization on FD-SOI MOSFET

| Processparameter | Value |
|---|---|
| Tsi, (nm) | 35 |
| Tox, (nm) | 9 |
| BOX, (nm) | 500 |
| LGeff, (nm) | 350 |
| Target Bias | |
| VGS (V) | 0.8 |
| VD (V) | 3.3 |
| Optimization | |
| Wp (nm) | 24 |
| NB (cm$^{-3}$) | $4 \times 10^{17}$ |
| NA (cm$^{-3}$) | $8 \times 10^{19}$ |
| N- (cm$^{-3}$) | $5 \times 10^{19}$ |
| WGeff (μm) | 9.5 |
| VGB (V) | -0.8 |
| SPAC (μm) & N | Extracted to meet target Bipolar leakage |

TABLE 2

Design Equations and the "equation"-based design flow for optimization

Design Example
// Sec. I - CONSTANTS:
Electric dielectric constant in space.
εo = 8.85 × 10$^{-12}$ (F/m)
Relative dielectric constant of Silicon.
εsi = 11.68
relative dielectric constant of Silicon Dioxide.
εox = 3.9
Default (or extracted) value for electron channel mobility.
μn = 1350 × 10$^{-4}$ (m$^2$/(V.s))
Default (or extracted) value for Hole mobility.
μh = 480 × 10$^{-4}$ (m$^2$/(V.s))
Default value for electron Saturation-Velocity.
vsat = 10$^5$ (m/s)
Default values for parameters defining impact-ionization current.

TABLE 2-continued

Design Equations and the "equation"-based design flow for optimization $\frac{\alpha}{\Omega} = 4 \times 10^5 (1/V)$ lm × Ω = 50
Γ = 0.5
Workfunction at the front Gate (default or extracted).
$\varphi_{MS}^{f} = -0.75$ (V)
Workfunction at the Gate relative to higher doped P_Pocket (default or extracted)
$\varphi_{MS\_Pocket}^{f} = -0.9$ (V)
Workfunction at the back gate (default or extracted).
$\varphi_{MS}^{b} = 0.5$ (V)
Intrinsic carrier concentration of Silicon.
ni = 1.5 × 10$^{16}$ (m$^{-3}$)
Thermal-Voltage at room temperature.
vth = 26 × 10$^{-3}$ (V)
Electron charge unit.
q = 1.6 × 10$^{-19}$ (C)
Correction factor accounting to charging in BOX.
Corr = 0.8
    // Sec. II -Technology-specific process parameters and dimensions:
Physical thickness of front Silicon film.
tsi = 35 × 10$^{-9}$ (m)
Physical thickness of BOX.
BOX = 0.5 × 10$^{-6}$ (m)
Physical thickness of front oxide.
tox = 9 × 10$^{-9}$ (m)
Effective Gate length or channel length.
LGeff = 0.35 × 10$^{-6}$ (m)
Effective Gate width.
WGeff = 9.5 × 10$^{-6}$ (m)
Body doping concentration
Nb = 4 × 10$^{17}$ (cm$^{-3}$)
Pocket doping concentration
NA = 8 × 10$^{19}$ (cm$^{-3}$)
LDD doping concentration
N$^{-}$ = 5 × 10$^{19}$ (cm-3)
Lateral width of P_ Pocket
Wp = 24 (nm)
Constant capturing DIBL effect between technology nodes.
γ = 1.5
    // Sec. III - Design Equations for Calculation of Front threshold-voltage independent
of short-channel effects. (Source: HYUNG-KYU et al., "Threshold voltage of thin-film
Silicon-On-Insulator (SOI) MOSFET's, IEEE Trans. Elec. Dev., vol. 30, no. 10, pp.
1244-1251, October 1983).
    Case-1: The Back-Surface of Front-Silicon film that interfaces the BOX is
    depleted:

$$\text{VTHO} = \phi_{MS}^{f} - \frac{q \times Qff}{CFox} + 2\phi B + \frac{q \times NB \times tsi}{2 \times CFox} + \frac{\varepsilon o \times \varepsilon si}{tsi \times CFox} \times (2\phi B - \Psi sb) \qquad \text{Eq. 1}$$

$$\phi B = vth \times \ln\left(\frac{Nb}{ni}\right)$$

$$CFox = \frac{\varepsilon o \times \varepsilon ox}{tox} \qquad \text{Eq. 2}$$

$$\Psi_{sb} = \frac{CBOX}{CBOX + Cb} \times (V_{GB} - V_{GB,acc}) \qquad \text{Eq. 3}$$

$$Cb = \frac{\varepsilon o \times \varepsilon si}{tsi} \qquad \text{Eq. 4}$$

$$CBOX = \frac{\varepsilon o \times \varepsilon ox}{Corr \times BOX} \qquad \text{Eq. 5}$$

$$V_{GB,acc} = \phi_{MS}^{b} - \frac{Qfb}{CBOX} - \frac{Cb}{CBOX} \times 2 \times \phi B + \frac{q \times Nb \times tsi}{2 \times CBOX} \qquad \text{Eq. 6}$$

Case-2: The Back-Surface of Front-Silicon film that interfaces the BOX is
    inverted:
    In that case the VGB in Eq. 3 is large enough to bring the Ψsb equaling 2 × φB,
    and the VTHO of Eq. 1 collapses to:

$$\text{VTHO} = \phi_{MS}^{f} - \frac{q \times Qff}{CFox} + 2\phi B + \frac{q \times NB \times tsi}{2 \times CFox} \qquad \text{Eq. 7}$$

TABLE 2-continued

Design Equations and the "equation"-based design flow for optimization

Case-3: The Back-Surface of Front-Silicon film that interfaces the BOX is accumulated:
At the onset of accumulation the $\Psi$sb of Eq. 1 equals 0, and the VTHO of Eq. 1 converges to:

$$\text{VTHO} = \varphi_{MS}^f - \frac{q \times \text{Qff}}{\text{CFox}} + 2\varphi\varphi - \frac{q \times \text{NB} \times \text{tsi}}{2 \times \text{CFox}} + \frac{\varepsilon o \times \varepsilon si}{\text{tsi} \times \text{CFox}} \times 2 \times \varphi B \qquad \text{Eq. 8}$$

// Accounting to Short-Channel-Effects (SCE).
 There exists a RollOff component and a RollUp component to the threshold-voltage. Both become significant at the lower LGeff value. They also become significant at the higher bias to Drain. VD
VT = VTHO + RollOff(LGeff, VD) + RollUp(LGeff, VD)   Eq. 9
 // RollOff is due to combined effect from DIBL due to VD and short LGeff, and from the aggregate transversal barrier lowering (between Front-Gate & Back-Gate); Eq. 10 below gives good proxy to a relatively small lowering of the transversal barrier at $2 \times \varphi$B when -

$$\text{RollOff}(\text{LGeff}, \text{VD}) = -\left[(2 \times \phi B - \psi o) + \text{VD} \times e^{\frac{-LGeff}{\gamma^A \times lc}}\right] \qquad \text{Eq. 10}$$

$$\psi_0 = \text{vth} \times \ln\left(\frac{N^- \times NA}{ni^2}\right)$$

$$lc = \sqrt{\frac{\varepsilon o \times \varepsilon si \times tox \times tsi}{\varepsilon o \times \varepsilon ox}}$$

// RollUp is due to HALO encroachment under the Gate. It becomes significant in short-channels (short LGeff) as it then constitutes significant portion of higher doping in Body. It also becomes more pronounced with lower VD as DIBL becomes then suppressed;
It is modeled function of the difference between Threshold-Voltage in HALO and in Body relative to an applied VD and the LGeff.

$$\text{RollUp}(\text{LGeff}, \text{VD}) = 2 \times \left[K - \frac{1}{\partial \text{HALO}}\right] \times \Psi_{imp} \times \partial \text{HALO} \times e^{\frac{-LGeff}{2 \times (\gamma)^A \times lc}} \qquad \text{Eq. 11}$$

$$K = \frac{2}{lc} \times \left[\sqrt{\frac{\text{VTHOP} - \text{VTHO}}{\text{VD}}}\right]$$

$$\text{VTHOP} \cong \phi_{MS,Pocket}^f - \frac{q \times \text{Qff}}{\text{Cof}} + 2\phi p + \frac{q \times NA \times xd}{\text{CFox}}$$

$$xd = 2 \times \sqrt{\frac{\varepsilon o \times \varepsilon si \times \phi p}{q \times NA}}$$

$$\phi p = \text{vth} \times \ln\left(\frac{NA}{ni}\right)$$

$\Psi_{imp} = \psi o - \varphi B$
$\partial \text{HALO} = Wp + \text{with ofP\_Halo}$
// Sec. IV - Extracting the WGeff that meets the targeted saturated drive current at the targeted Front-Gate bias and VT. (Source: KWYRO LEE, MICHAEL SHUR, TOR A. FJELDLY, and TROND YTTERDAL, Semiconductor Device Modeling for VLSI, New Jersey: Prentice Hall, pp. 238-256, 1993).
 Case-1: Drive current depends on Saturation-velocity due to the Short-Channel effect defined when $$\frac{\text{vsat}}{\mu e} \times \text{LGeff} \ll \text{VGS} - \text{VT} \qquad \text{Eq. 12}$$

Then the WGeff is:

$$\text{WGeff} = \frac{\text{ISat}}{\text{vsat} \times \text{CFox} \times (\text{VGS} - \text{VT})^-} \qquad \text{Eq. 13}$$

$$\text{VKnee} = \frac{\text{vsat}}{\mu e} \times \text{LGeff} \qquad \text{Eq. 14}$$

TABLE 2-continued

Design Equations and the "equation"-based design flow for optimization

The Isat in Eq. 13 is the targeted Saturation drive current, and The VKnee of
Eq. 14 is the device Knee-voltage between linear and saturated drive current.
Case-2: Drive current depends on low-field Mobility due to relatively long
LGeff. This occurs when the criteria of Eq. 12 is not met.

$$WGeff = \frac{2 \times ISat \times LGeff}{\mu e \times CFox \times (VGS - VT)^2}$$ Eq. 15

$$VKnee = VGS - VT$$ Eq. 16

Given that the ISat and the VT targets are defined and so is the VGS, and rest of process
parameters are known, the WGeff is extracted either from Eq. 13 or from Eq. 15 depending
on the magnitude of the LGeff relative to Eq. 12.
(The model parameters for ISAT are extracted from built-in Test-structures).
// Sec. V - Determining the Vdrop per SPAC/2 segment. (Source: STREETMAN,
Solid State Electronic Devices. 4th ed. New Jersey: Prentice Hall, pp. 244-247, 1995).

$$IBJT_{Drain}(Vdrop) = q \times \left(\frac{SPAC \times tsi}{2 \times const}\right) \times \frac{Dn}{Ln} \times$$ Eq. 17

$$(K1(Vdrop) \times e^{-\partial HALO/Ln} - K2(Vdrop) \times e^{\partial HALO/Ln})$$

$$IBJT_{Source}(Vdrop) =$$ Eq. 18

$$q \times \left(\frac{SPAC \times tsi}{2 \times const}\right) \times \frac{Dn}{Ln} \times \left[\frac{\frac{ni^2}{Np} \times \left(e^{-\frac{\partial HALO}{Ln}} + e^{-\frac{\partial HALO}{Ln}}\right) + 2 \times \frac{ni^2}{NP}}{e^{-\frac{\partial HALO}{Ln}} - e^{-\frac{\partial HALO}{Ln}}}\right]$$

The const in Eq. 17 & Eq. 18 accounts to an effective-area because the Vdrop varies throughout
the P_Pocket alongside the Gate-width.

$$K1(Vdrop) = \frac{\frac{ni^2}{Np} \times e^{\frac{Vdrop}{n \times vth}} \times e^{-\frac{\partial HALO}{Ln}} + \frac{ni^2}{Np}}{e^{-\frac{\partial HALO}{Ln}} - e^{-\frac{\partial HALO}{Ln}}}$$

$$K2(Vdrop) = \frac{-\frac{ni^2}{Np} - \frac{ni^2}{Np} \times e^{\frac{q \times Vdrop}{n \times vth}} \times e^{-\frac{\partial HALO}{Ln}}}{e^{-\frac{\partial HALO}{Ln}} - e^{-\frac{\partial HALO}{Ln}}}$$

Magnitude for Bipolar current is set order(s) of magnitude lower than the ISat, and the
corresponding Vdrop is extracted.
(The model parameters for the Bipolar current are extracted from built-in Test-structures).
// Sec. VI - Determining the corresponding Body-Current (Ib) for the targeted ISat
and VDS. That is II-current. (Source: X. GU et al., "A Surface-Potential-Based Extrinsic
Compact MOSFET Model", Tech. Proceed. 2003 Nanotech. Conf. and Trade Show, vol.
2, pp. 364-367, San Francisco., February 2003).

$$Ib = ISat \times \left[\frac{\alpha}{\Omega} \times (VDS - \Gamma \times VKnee) \times e^{-\frac{lm \times \Omega}{VDS - \Gamma \times VKnee}}\right]$$ Eq. 19

Ib is extracted from Eq. 19.
(The model parameters for Ib are extracted from built-in Test-structures).

What is claimed is:

1. A single-leg Silicon-On-Insulator Metal-Oxide-Semiconductor (SOI-MOS) comprising;
 a highly P-doped pocket (P_Pocket) in a Front-Silicon under a device Gate; this P_Pocket interfaces on one side with the full thickness of a MOS Body (P_Body) that is alongside the peripheral width of a device structure while it forms a junction with the full thickness of a Source region on its other opposite side, this P-doped pocket has a higher doping relative to the P_Body and is wired to a configuration of Body-Tied-Source (BTS); this configuration of BTS is made of one or multiple regions of BTS;
 this arrangement imposes a hard barrier for an Impact-Ionizations current in the P_Body to laterally diffuse this current through the Body/Source junction and forces it to conduct instead through the P_Pocket alongside the peripheral width of the device structure to the configuration of BTS that connects to the P_Pocket, this configuration of BTS increases or maximizes the conductance that the Impact-Ionizations current sees from the P_Body;
 a higher Impact-Ionizations current (II-current) resulting from a device structure that has a larger peripheral width requires a proportional scale-up of the equivalent conductance between the P_Body and the configuration of BTS; this is accomplished with insertion of additional region(s) of BTS;
 for a given effective-Gate-Width (WGeff), a given insignificant Bipolar current compared to the device current, a given operating bias and a given Impact-Ionizations current, the number of BTS regions (N) and the spacing(s) (SPAC) between these regions conform to the model, $$II-\text{current} =$$
$$I_{Bipolar} + Vdrop \times (N) \times (q \times \mu_h \times NA) \times \frac{Wp \times (tsi - Depl\max) \times 4}{SPAC}$$
$$WGeff = N \times SPAC$$

when both edges alongside the device peripheral width on the Source side of the device are doped n-type;
the number of BTS regions (N) and the spacing(s) between these regions also conform to the model, $$II-\text{current} =$$
$$I_{Bipolar} + Vdrop \times (N-1) \times (q \times \mu_h \times NA) \times \frac{Wp \times (tsi - Depl\max) \times 4}{SPAC}$$
$$WGeff = (N-1) \times SPAC$$

when both edges alongside the device peripheral width on the Source side of the device are BTS regions;

the claim extends to analogous PMOS structures and layouts;

the claim extends to SOI-MOS devices fabricated on any insulating wide-bandgap semiconductor, or buried dielectric or material beside Silicon-dioxide, this includes Silicon-On-Sapphire (SOS), Silicon-On-Nothing, Diamond, and all insulating substrates (e.g. flexible organic substrates);

the claim extends to SOI-MOS devices comprised of multi-legs (or multi-fingers) device structures in which at least a one leg structure is comprised of the claimed proprietary SOI-MOS incorporating this unique wiring of a P_Pocket to a configuration of BTS;

the claim extends to all Integrated-Circuits that use a single-leg or a multi-legs Silicon-On-Insulator Metal-Oxide-Semiconductor (SOI-MOS) incorporating this unique wiring of a P_Pocket to a configuration of BTS to increase or maximize the conductance that an Impact-Ionizations current sees from a P_Body.

\* \* \* \* \*